(12) United States Patent
Myers

(10) Patent No.: US 11,133,614 B2
(45) Date of Patent: Sep. 28, 2021

(54) LOW INSERTION FORCE CONTACT AND METHOD OF MANUFACTURE

(71) Applicant: TE CONNECTIVITY CORPORATION, Berwyn, PA (US)

(72) Inventor: Marjorie Kay Myers, Mount Wolf, PA (US)

(73) Assignee: TE Connectivity Services GmbH

( * ) Notice: Subject to any disclaimer, the term of this patent is extended or adjusted under 35 U.S.C. 154(b) by 0 days.

(21) Appl. No.: 16/557,009

(22) Filed: Aug. 30, 2019

(65) Prior Publication Data

US 2021/0066834 A1 Mar. 4, 2021

(51) Int. Cl.
- *H01R 13/03* (2006.01)
- *C25D 3/46* (2006.01)
- *C25D 5/48* (2006.01)
- *H01R 43/00* (2006.01)

(52) U.S. Cl.
CPC .............. *H01R 13/03* (2013.01); *C25D 3/46* (2013.01); *C25D 5/48* (2013.01); *H01R 43/00* (2013.01)

(58) Field of Classification Search
CPC .......... H01R 13/03; H01R 43/00; C25D 5/48; C25D 3/46
See application file for complete search history.

(56) References Cited

U.S. PATENT DOCUMENTS

| | | | | |
|---|---|---|---|---|
| 4,662,702 A * | 5/1987 | Furuya | | H01R 13/03 439/630 |
| 2005/0106408 A1* | 5/2005 | Chen | | H01R 13/03 428/629 |
| 2006/0105641 A1* | 5/2006 | Rehbein | | H01R 13/03 439/886 |
| 2011/0162707 A1* | 7/2011 | Schuisky | | H01L 31/022425 136/256 |
| 2012/0115375 A1* | 5/2012 | Kakuta | | C25D 5/44 439/877 |
| 2013/0090012 A1* | 4/2013 | Natter | | H01R 13/04 439/625 |
| 2013/0295287 A1* | 11/2013 | Tsukamoto | | C23C 18/1844 427/304 |
| 2014/0273607 A1* | 9/2014 | Orand | | G06F 1/163 439/447 |
| 2015/0013480 A1* | 1/2015 | Bugaj | | C23C 18/1605 73/866.5 |
| 2015/0194746 A1* | 7/2015 | Shibuya | | C23C 22/07 439/887 |
| 2015/0295333 A1* | 10/2015 | Shibuya | | C25D 5/10 439/887 |

FOREIGN PATENT DOCUMENTS

| | | | | |
|---|---|---|---|---|
| JP | 2014-175196 | * | 9/2014 | ............. H01R 13/03 |
| JP | 2014-R49859 | * | 9/2014 | |

* cited by examiner

*Primary Examiner* — Truc T Nguyen

(57) ABSTRACT

A low insertion force contact includes a conductive base layer extending to a mating end including a mating interface configured for mating electrical connection to a mating contact. A silver coating layer is provided on the conductive base layer. The silver coating layer is provided at the mating end. A silver sulfide surface layer forms a solid lubricant directly on the silver coating layer. The silver sulfide surface layer forms a film defining a surface of the low insertion force contact having a controlled thickness at the mating interface.

20 Claims, 4 Drawing Sheets

LOW INSERTION FORCE CONTACT AND METHOD OF MANUFACTURE

BACKGROUND OF THE INVENTION

The subject matter herein relates generally to a low insertion force contact.

Contacts are used in a variety of applications. The contacts are typically mated to a mating component, such as a circuit board or a mating electrical connector at a mating interface. During mating, the contact may experience wipe against the mating component and friction between the contact and the mating component at the mating interface may be problematic. For instance, when mating numerous contacts simultaneously, the friction of each of the contacts leads to high mating forces for mating with the mating component. The coefficient of friction of the material of the contact at the mating interface determines the mating force needed to mate the contact(s) with the mating component.

To reduce mating forces, some known systems use a lubricant on the contact. However, the lubricant is messy, may be difficult to apply, and collects dust and debris over time, making the use of lubricant less desirable. The lubricant may affect the conductivity of the contact with the mating component, making the lubricant unusable in certain applications. The lubricant may be wiped away after mating, making re-mating of the contact difficult. The lubricant may be unstable at high temperatures, and thus may be unusable in certain applications.

A need remains for a low insertion force contact.

BRIEF DESCRIPTION OF THE INVENTION

In one embodiment, a low insertion force contact is provided. The low insertion force contact includes a conductive base layer extending to a mating end including a mating interface configured for mating electrical connection to a mating contact. A silver coating layer is provided on the conductive base layer. The silver coating layer is provided at the mating end. A silver sulfide surface layer forms a solid lubricant directly on the silver coating layer. The silver sulfide surface layer forms a film having a controlled thickness at the mating interface.

In another embodiment, a low insertion force contact is provided. The low insertion force contact includes a conductive base layer extending to a mating end including a mating interface configured for mating electrical connection to a mating contact. The conductive base layer is a copper base layer or a copper alloy base layer. A nickel coating layer is provided directly on the conductive base layer. The nickel coating layer is provided at the mating end. A silver coating layer is provided directly on the nickel coating layer. The silver coating layer is provided at the mating end. A silver sulfide surface layer is provided directly on the silver coating layer. The silver sulfide surface layer forms a solid lubricant film at the mating interface.

In a further embodiment, a method of manufacturing a low insertion force contact is provided. The method includes providing a conductive base layer including a mating end including a mating interface configured for mating electrical connection to a mating contact. The method applies a silver coating layer on the conductive base layer at the mating end. The method forms a silver sulfide surface layer directly on the silver coating layer to define a solid lubricant film at the mating interface. The solid lubricant film has a controlled thickness of silver sulfide material at the mating interface.

DETAILED DESCRIPTION OF THE INVENTION

Figure 1:
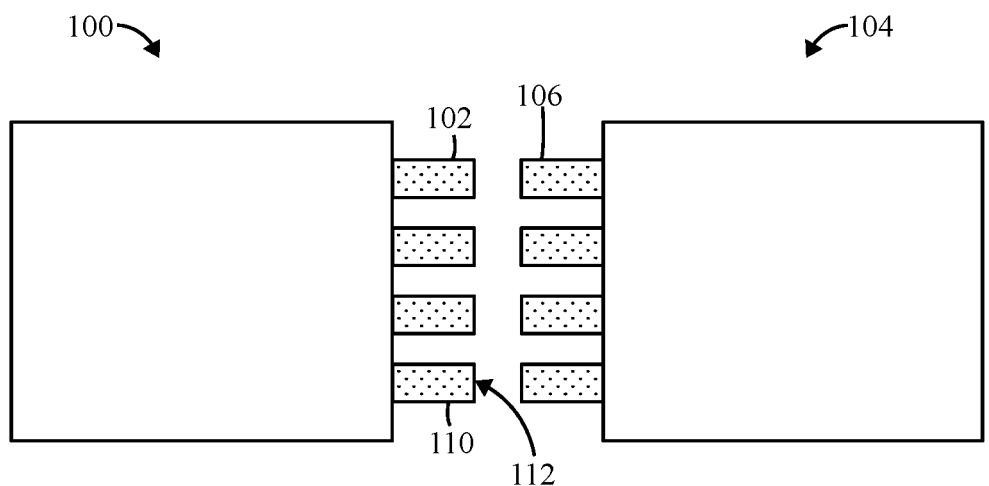
FIG. 1 is a schematic illustration of an electrical component having low insertion force contacts in accordance with an exemplary embodiment.
Figure 1A:
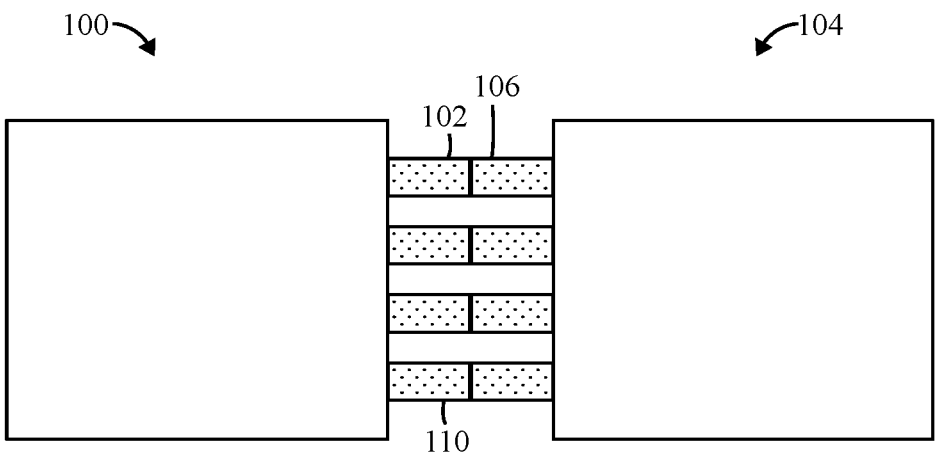
FIG. 1A is a schematic illustration of an electrical component showing the low insertion force contacts at initial mating positions in accordance with an exemplary embodiment.
Figure 1B:
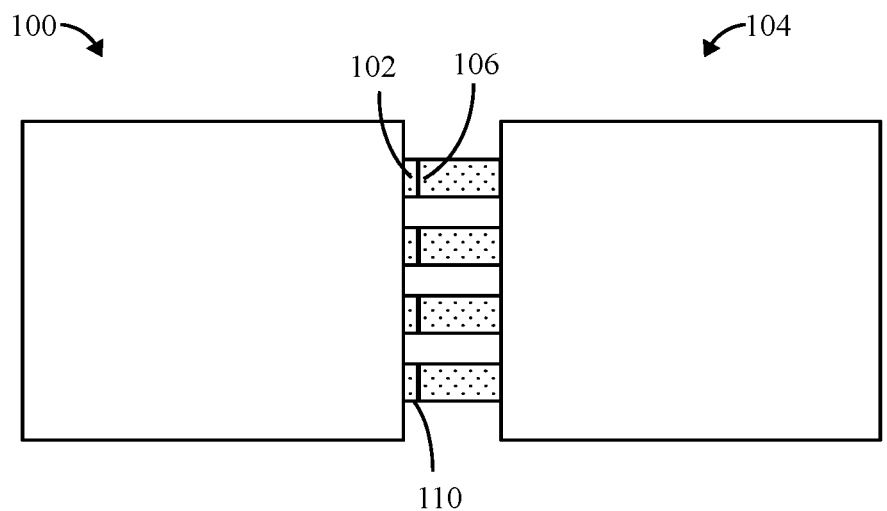
FIG. 1B is a schematic illustration of an electrical component showing the low insertion force contacts at final mating positions in accordance with an exemplary embodiment.

FIG. 1 is a schematic illustration of an electrical component 100 having low insertion force contacts 102 in accordance with an exemplary embodiment. FIG. 1A is a schematic illustration of the electrical component 100 showing the low insertion force contacts 102 at initial mating positions in accordance with an exemplary embodiment. FIG. 1B is a schematic illustration of the electrical component 102 showing the low insertion force contacts 102 at final mating positions in accordance with an exemplary embodiment. The electrical component 100 is configured to be mated with a mating electrical component 104 having mating contacts 106. Optionally, the mating contacts 106 may be low insertion force mating contacts.

In various embodiments, the electrical component 100 is an electrical connector, such as a plug connector, a socket connector, a card edge connector, and the like. In other various embodiments, the electrical component 100 is a printed circuit board, such as a circuit card. In various embodiments, the mating electrical component 104 is an electrical connector, such as a plug connector, a socket connector, a card edge connector, and the like. In other various embodiments, the mating electrical component 104 is a printed circuit board, such as a circuit card.

In various embodiments, the contact 102 is a stamped and formed contact, such as a pin, a socket, a blade, a spring beam, and the like. In other various embodiments, the contact 102 is a circuit contact of a printed circuit board, such as a circuit pad or circuit trace of the printed circuit board. In various embodiments, the mating contact 106 is a stamped and formed contact, such as a pin, a socket, a blade, a spring beam, and the like. In other various embodiments, the contact 106 is a circuit contact of a circuit board, such as a circuit pad or circuit trace of the printed circuit board.

The low insertion force contact 102 has a solid lubricant 110 formed on the surface of the contact 102. For example, the solid lubricant 110 is formed as a film at a mating end 112 of the contact 102. In an exemplary embodiment, the solid lubricant 110 is part of the chemical structure of the contact 102. For example, the contact 102 includes a silver layer and the solid lubricant 110 is a silver sulfide surface layer formed as a film on the exterior of the silver layer. The solid lubricant 110 is the exterior layer or surface of the contact 102 and lowers the coefficient of friction of the contact 102 as compared to a contact that does not include the solid lubricant 110 at the surface, such as a contact that includes a silver layer at the surface of the contact. The solid lubricant 110 reduces mating friction when mating with the mating contact 106.

Figure 2:
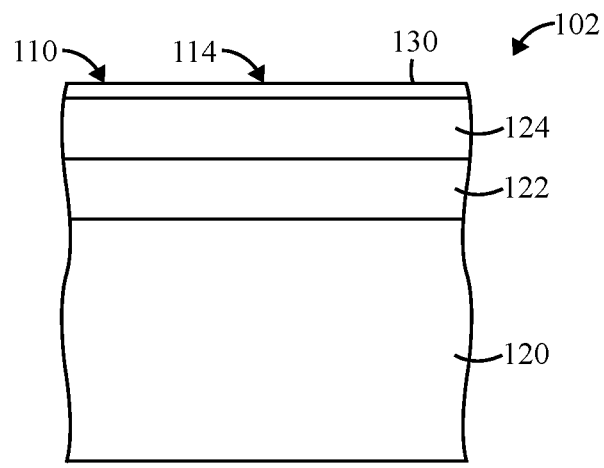
FIG. 2 is a sectional view of the low insertion force contact in accordance with an exemplary embodiment.

FIG. 2 is a sectional view of the low insertion force contact 102 in accordance with an exemplary embodiment. The contact 102 includes a conductive base layer 120, may include at least one barrier coating layers 122, 124 provided on the conductive base layer 120, and includes a silver sulfide surface layer 130 at the surface of the contact 102. In an exemplary embodiment, the silver sulfide surface layer 130 is provided directly on the coating layer 124; however, the silver sulfide surface layer 130 may be provided directly on the conductive base layer 120 in other various embodiments, such as when the conductive base layer 120 is a silver base layer. The barrier coating layers 122, 124 are provided to enhance properties of the contact 102. For example, the barrier coating layers 122, 124 may provide corrosion resistance, improve solder ability, improved conductivity, improve thermal properties, such as increasing operating temperature of the contact 102, and the like. The silver sulfide surface layer 130 forms the solid lubricant 110 for the contact 102 increasing lubricity of the contact 102. The silver sulfide surface layer 130 lowers the insertion force or mating force with the mating contact 106 (shown in FIG. 1). The silver sulfide surface layer 130 may enhance durability of the contact 102.

In an exemplary embodiment, the conductive base layer 120 is a copper base layer or a copper alloy base layer. The conductive base layer 120 may be another metal base layer, such as a steel base layer, an aluminum base layer, a silver base layer, and the like. The inner coating layer 122 is a nickel coating layer. However, the inner coating layer 122 may be another type of barrier coating layer other than a nickel coating layer in alternative embodiments. The outer coating layer 124 is a silver coating layer. The silver sulfide surface layer 130 forms the solid lubricant 110 directly on the silver coating layer 124. The contact 102 may include additional layers in alternative embodiments. In other various embodiments, the contact 102 may be provided without the nickel coating layer 122, rather having the silver coating layer 124 provided directly on the conductive base layer 120.

The coating layers 122, 124 are provided at the mating end 112 (shown in FIG. 1) of the contact 102. Optionally, the contact 102 may be selectively coated, such as at the mating end 112, with other portions of the contact 102 being uncoated. In other various embodiments, other portions, in addition to the mating end 112 may be coated. In various embodiments, the entire contact 102 is coated. In various embodiments, the coating layers 122, 124 are provided on the contact 102 by a plating process or a pre-plating process. The coating layers 122, 124 may be provided by other processes in alternative embodiments.

In an exemplary embodiment, the silver sulfide surface layer 130 is provided at a mating interface 114 of the contact 102 at the mating end 112. The silver sulfide surface layer 130 may be selectively formed at controlled areas of the coating layers 122, 124. In other various embodiments, the silver sulfide surface layer 130 may be formed on the entire coating layer 124. In various embodiments, the silver sulfide surface layer 130 is selectively formed on the mating end 112, such as at the mating interface 114, with other areas of the mating end 112 being devoid of the silver sulfide surface layer 130. In other various embodiments, the mating end 112 is entirely covered by the silver sulfide surface layer 130. In other various embodiments, other portions, in addition to the mating end 112 may have the silver sulfide surface layer 130 formed thereon. In various embodiments, the silver sulfide surface layer 130 may be formed on the entire contact 102.

In an exemplary embodiment, the silver sulfide surface layer 130 is actively formed directly on the silver coating layer 124. The silver sulfide surface layer 130 may be formed by converting the surface atoms of the silver coating layer 124 to silver sulfide. For example, the silver sulfide surface layer 130 is formed by a chemical treatment of the silver coating layer 124 to form silver sulfide at the surface of the contact 102. The silver coating layer 124 may be tarnished by a controlled tarnishing process to form the silver sulfide surface layer 130 on the silver coating layer 124. In an exemplary embodiment, the silver sulfide surface layer 130 is formed by a non-hazardous chemical treatment process; however, the silver sulfide surface layer 130 may be formed by other chemical treatment processes in alternative embodiments. Optionally, the chemical treatment may be a sulfide-free chemical treatment. The silver sulfide surface layer 130 is formed as a film on the surface of the contact 102 having a controlled thickness. For example, the silver sulfide surface layer is built up evenly and consistently on the silver coating layer 124. Optionally, the silver sulfide surface layer 130 may have a constant thickness on the silver coating layer 124. In an exemplary embodiment, the controlled thickness of the silver sulfide surface layer 130 is contact functional. Contact functional is defined as being of sufficient to function for the intended application for an electrical contact to define a mating interface for mating with a mating contact. The silver sulfide surface layer 130 is contact functional when the silver sulfide surface layer 130 does not cause electrical connection issues between the contact 102 and the mating contact. In various embodiments, the silver sulfide surface layer 130 is formed to have a uniform coloring (such as within a color range) for visual perception. The coloring may be in the visible color spectrum, such as from red to violet. Optionally, the coloring may be uniformly colored within the yellow color range, uniformly colored within the green color range, uniformly colored within the blue color range, or uniformly colored within another color range. In an exemplary embodiment, the contact 102 is treated to achieve the uniform coloring, which corresponds to a uniform thickness of the silver sulfide formed on the surface of the contact 102.

The silver sulfide surface layer 130 is formed by chemically reacting a sulfur-based product with the silver coating layer 124 to chemically form the silver sulfide on the surface of the contact 102. The silver sulfide surface layer 130 may be formed by other processes, such as physical vapor deposition (PVD), chemical vapor deposition (CVD), and the like. The solid lubricant 110 forms part of the contact 102. In various embodiments, the silver sulfide surface layer 130 may be chemically bonded with the silver coating layer 124. As such, the silver sulfide surface layer 130 is less susceptible to wear and removal as compared to other lubricants, such as grease or liquid lubricants, applied on the exterior surface of the contact 102. Thus, the silver sulfide surface layer 130 is durable for numerous mating cycles (for example, many more mating cycles than applied lubricants). In an exemplary embodiment, the silver sulfide surface layer 130 is conductive, providing an efficient mating interface for the contact 102. In an exemplary embodiment, the silver sulfide surface layer 130 is displaceable, such as during contact wiping, to allow electrical connection between the contact 102 and the mating contact.

Figure 3:
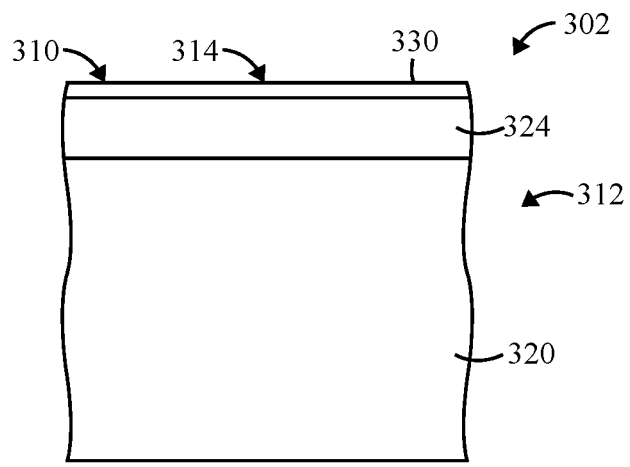
FIG. 3 is a sectional view of a low insertion force contact in accordance with an exemplary embodiment.

FIG. 3 is a sectional view of a low insertion force contact 302 in accordance with an exemplary embodiment. The low insertion force contact 302 may be used with the electrical component 100 (shown in FIG. 1) in place of the contact 102 (shown in FIG. 1).

The contact 302 includes a conductive base layer 320, a silver coating layer 324 provided directly on the conductive base layer 320, and a silver sulfide surface layer 330 provided directly on the silver coating layer 324. In an exemplary embodiment, the conductive base layer 320 is a copper base layer or a copper alloy base layer. The conductive base layer 320 may be another metal base layer, such as a steel base layer, an aluminum base layer, a silver base layer, and the like. The coating layer 324 is a silver coating layer. The silver sulfide surface layer 330 forms a solid lubricant 310 at the surface of the contact 302 increasing lubricity of the contact 302. The silver sulfide surface layer 330 lowers the insertion force or mating force with the mating contact 106 (shown in FIG. 1). The coating layer 324 and the silver sulfide surface layer 330 are provided at a mating end 312 of the contact 302. In other various embodiments, other portions, in addition to the mating end 312 may be coated. In various embodiments, the entire contact 302 is coated.

In an exemplary embodiment, the silver sulfide surface layer 330 is provided at a mating interface 314 of the contact 302 at the mating end 312. The silver sulfide surface layer 330 may be selectively formed at controlled areas of the coating layer 324. In other various embodiments, the silver sulfide surface layer 330 may be formed on and cover the entire coating layer 324. In various embodiments, the silver sulfide surface layer 330 is selectively formed on the mating end 312, such as at the mating interface 314, with other areas of the mating end 312 being devoid of the silver sulfide surface layer 330. In other various embodiments, the mating end 312 is entirely covered by the silver sulfide surface layer 330. In other various embodiments, other portions, in addition to the mating end 312 may have the silver sulfide surface layer 330 formed thereon. In various embodiments, the silver sulfide surface layer 330 may be formed on the entire contact 302.

In an exemplary embodiment, the silver sulfide surface layer 330 is actively formed directly on the silver coating layer 324. For example, the silver sulfide surface layer 330 is formed by a chemical treatment of the silver coating layer 324 to form silver sulfide at the surface of the contact 302. The silver coating layer 324 may be tarnished by a controlled tarnishing process to form the silver sulfide surface layer 330 on the silver coating layer 324. In an exemplary embodiment, the silver sulfide surface layer 330 is formed by a non-hazardous chemical treatment process; however, the silver sulfide surface layer 330 may be formed by other chemical treatment processes in alternative embodiments. The silver sulfide surface layer 330 is formed as a film on the surface of the contact 302 having a controlled thickness. For example, the silver sulfide surface layer is built up evenly and consistently on the silver coating layer 324. Optionally, the silver sulfide surface layer 330 has a constant thickness on the silver coating layer 324. In an exemplary embodiment, the controlled thickness of the silver sulfide surface layer 330 is contact functional. In various embodiments, the silver sulfide surface layer 330 is formed to have a uniform coloring (such as within a color range) for visual perception.

In an exemplary embodiment, the contact 302 is treated to achieve the uniform coloring, which corresponds to a uniform thickness of the silver sulfide formed on the surface of the contact 302.

The silver sulfide surface layer 330 is formed by chemically reacting a sulfur-based product with the silver coating layer 324 to chemically form the silver sulfide on the surface of the contact 302. As such, the solid lubricant 310 forms part of the contact 302. In various embodiments, the silver sulfide surface layer 330 may be chemically bonded with the silver coating layer 324. As such, the silver sulfide surface layer 330 is less susceptible to wear and removal as compared to lubricants, such as grease or liquid lubricants, applied on the exterior surface of the contact 302. Thus, the silver sulfide surface layer 330 is durable for numerous mating cycles (for example, many more mating cycles than applied lubricants). In an exemplary embodiment, the silver sulfide surface layer 330 is conductive providing an efficient mating interface for the contact 302. In an exemplary embodiment, the silver sulfide surface layer 330 is displaceable, such as during contact wiping, to allow electrical connection between the contact 302 and the mating contact.

Figure 4:
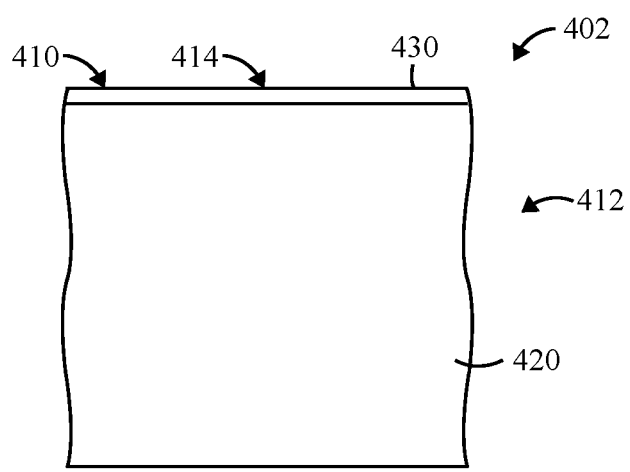
FIG. 4 is a sectional view of a low insertion force contact in accordance with an exemplary embodiment.

FIG. 4 is a sectional view of a low insertion force contact 402 in accordance with an exemplary embodiment. The low insertion force contact 402 may be used with the electrical component 100 (shown in FIG. 1) in place of the contact 102 (shown in FIG. 1).

The contact 402 includes a silver base layer 420 and a silver sulfide surface layer 430 provided directly on the silver base layer 420. In an exemplary embodiment, the base layer 420 is a silver or silver alloy base layer. The silver sulfide surface layer 430 forms a solid lubricant 410 at the surface of the contact 402 increasing lubricity of the contact 402. The silver sulfide surface layer 430 lowers the insertion force or mating force with the mating contact 106 (shown in FIG. 1). In an exemplary embodiment, the silver sulfide surface layer 430 is provided at a mating interface 414 of the contact 402 at the mating end 412. The silver sulfide surface layer 430 may be selectively formed on the base layer 420 or may be formed on and cover the entire base layer 420.

In an exemplary embodiment, the silver sulfide surface layer 430 is actively formed directly on the silver base layer 420. For example, the silver sulfide surface layer 430 is formed by a chemical treatment of the silver base layer 420 to form silver sulfide at the surface of the contact 402. The silver base layer 420 may be tarnished by a controlled tarnishing process to form the silver sulfide surface layer 430 on the surface. In an exemplary embodiment, the silver sulfide surface layer 430 is formed by a non-hazardous chemical treatment process; however, the silver sulfide surface layer 430 may be formed by other chemical treatment processes in alternative embodiments. The silver sulfide surface layer 430 is formed as a film on the surface of the contact 402 having a controlled thickness. For example, the silver sulfide surface layer is built up evenly and consistently on the silver base layer 420. The silver sulfide surface layer 430 is formed by chemically reacting a sulfur-based product with the silver base layer 420 to chemically form the silver sulfide on the surface of the contact 402.

Figure 5:
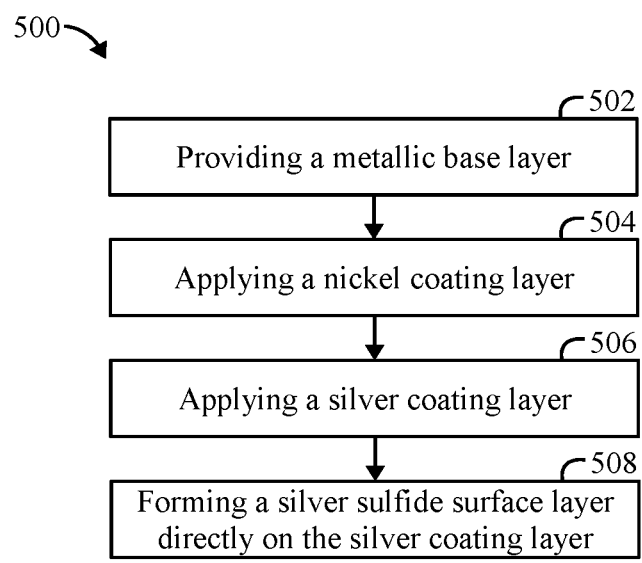
FIG. 5 is a flowchart illustrating a method of manufacturing a low insertion force contact in accordance with an exemplary embodiment.

FIG. 5 is a flowchart illustrating a method 500 of manufacturing a low insertion force contact in accordance with an exemplary embodiment. The method 500 includes the step of providing a conductive base layer at 502. The conductive base layer includes a mating end including a mating interface configured for mating electrical connection to a mating contact. The conductive base layer may be a copper base layer or a copper alloy base layer.

The method 500 includes the step of applying a nickel coating layer on the conductive base layer at 504. The nickel coating layer may be applied by plating the nickel coating layer directly on the conductive base layer. However, the nickel coating layer may be applied by other coating processes other than plating in alternative embodiments. The nickel coating layer may be selectively applied to the conductive base layer, such as at the mating end, leaving other sections of the conductive base layer uncoated.

The method 500 includes the step of applying a silver coating layer on the nickel coating layer and the conductive base layer at 506. The silver coating layer may be applied by plating the silver coating layer directly on the nickel coating layer. However, the silver coating layer may be applied by other coating processes other than plating in alternative embodiments. The silver coating layer may be selectively applied to the nickel coating layer and the conductive base layer, such as at the mating end, leaving other sections uncoated.

The method 500 includes the step of forming a silver sulfide surface layer directly on the silver coating layer to define a solid lubricant film at the mating interface at 508. In various embodiments, the silver sulfide surface layer is formed such that the solid lubricant film has a controlled thickness at the mating interface. The solid lubricant film may be formed to have a constant thickness. In various embodiments, the silver sulfide surface layer is formed by chemically treating the silver coating layer with a non-hazardous chemical treatment. The silver sulfide surface layer may be formed by treating the silver coating layer with a chemical treatment to achieve a uniform color film on the silver coating layer. The silver sulfide surface layer may be formed by treating the silver coating layer in a chemical bath. In various embodiments, the silver sulfide surface layer may be formed by controlling tarnishing of the silver coating layer.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A low insertion force contact having a mating interface configured for mating electrical connection to a mating contact when fully mated with the mating contact, the low insertion force contact comprising:
   a conductive base layer extending to a mating end, the conductive base layer being provided at the mating interface;
   a silver coating layer provided on the conductive base layer, the silver coating layer being provided at the mating interface at the mating end; and
   a silver sulfide surface layer forming a solid lubricant directly on the silver coating layer, the silver sulfide surface layer being provided at the mating interface at the mating end, the silver sulfide surface layer forming a film defining a surface of the low insertion force contact at the mating interface configured to interface with the mating contact when the mating contact is fully mated with the low insertion force contact, the film having a controlled thickness.

2. The low insertion force contact of claim 1, wherein the silver sulfide surface layer is actively formed directly on the silver coating layer.

3. The low insertion force contact of claim 1, wherein the silver sulfide surface layer lowers a coefficient of friction of the surface of the low insertion force contact from an initial point of contact to a final point of contact between the low insertion force contact and the mating contact compared to a coefficient of friction of the silver coating layer.

4. The low insertion force contact of claim 1, wherein the silver sulfide surface layer is an additive film formed directly on the silver coating layer.

5. The low insertion force contact of claim 1, wherein the silver sulfide surface layer is tarnished to have a controlled coloring at the mating interface corresponding to the controlled thickness.

6. The low insertion force contact of claim 1, wherein the silver sulfide surface layer is formed by a non-hazardous chemical treatment of the silver coating layer.

7. The low insertion force contact of claim 1, wherein the silver sulfide surface layer is a lubricious film on the silver coating layer.

8. The low insertion force contact of claim 1, wherein the silver sulfide surface layer has a controlled thickness.

9. The low insertion force contact of claim 1, wherein the silver sulfide surface layer is configured to be directly mated to the mating contact at the mating interface when the mating contact is fully mated with the low insertion force contact.

10. The low insertion force contact of claim 1, wherein an entire surface area of the mating end is covered by the silver sulfide surface layer.

11. The low insertion force contact of claim 1, further comprising a nickel coating layer between the conductive base layer and the silver coating layer.

12. The low insertion force contact of claim 1, wherein the conductive base layer is one of a copper base layer or a copper alloy base layer.

13. A low insertion force contact having a mating interface configured for mating electrical connection to a mating contact when fully mated with the mating contact, the low insertion force contact comprising:
   a conductive base layer extending to a mating end, the conductive base layer being provided at the mating interface, the conductive base layer being a copper base layer or a copper alloy base layer;
   a nickel coating layer provided directly on the conductive base layer, the nickel coating layer being provided at the mating interface at the mating end;

a silver coating layer provided directly on the nickel coating layer, the silver coating layer being provided at the mating interface at the mating end; and a silver sulfide surface layer provided directly on the silver coating layer, the silver sulfide surface layer being provided at the mating interface at the mating end, the silver sulfide surface layer forming a solid lubricant film defining a surface of the low insertion force contact at the mating interface configured to interface with the mating contact when the mating contact is fully mated with the low insertion force contact.

14. The low insertion force contact of claim 13, wherein the silver sulfide surface layer lowers a coefficient of friction of the surface of the low insertion force contact from an initial point of contact to a final point of contact between the low insertion force contact and the mating contact compared to a coefficient of friction of the silver coating layer.

15. A method of manufacturing a low insertion force contact having a mating interface configured for mating electrical connection to a mating contact when fully mated with the mating contact, the method comprising:

providing a conductive base layer including a mating end provided at the mating interface;

applying a silver coating layer on the conductive base layer at the mating end such that the silver coating layer is provided at the mating interface; and forming a silver sulfide surface layer directly on the silver coating layer to define a solid lubricant film defining a surface of the low insertion force contact at the mating interface for interfacing with the mating contact when the mating contact is fully mated with the low insertion force contact, the solid lubricant film having a controlled thickness of silver sulfide material at the mating interface.

16. The method of claim 15, wherein said forming the silver sulfide surface layer comprises chemically treating the silver coating layer with a non-hazardous chemical treatment to form the silver sulfide surface layer on the silver coating layer.

17. The method of claim 15, wherein said forming the silver sulfide surface layer comprises treating the silver coating layer with a chemical treatment to achieve a uniform color film on the silver coating layer.

18. The method of claim 15, wherein said forming the silver sulfide surface layer comprises controlled tarnishing of the silver coating layer to form the silver sulfide surface layer.

19. The method of claim 15, wherein said forming the silver sulfide surface layer comprises covering an entire surface area of the mating end of the low insertion force contact with the silver sulfide surface layer.

20. The low insertion force contact of claim 13, wherein an entire surface area of the mating end is covered by the silver sulfide surface layer.

* * * * *